United States Patent
Ohara

(10) Patent No.: US 10,884,235 B2
(45) Date of Patent: Jan. 5, 2021

(54) DRAWING APPARATUS AND DRAWING METHOD

(71) Applicant: JVC KENWOOD Corporation, Yokohama (JP)

(72) Inventor: Tatsuya Ohara, Yokohama (JP)

(73) Assignee: JVCKENWOOD Corporation, Yokohama (JP)

( * ) Notice: Subject to any disclaimer, the term of this patent is extended or adjusted under 35 U.S.C. 154(b) by 482 days.

(21) Appl. No.: 15/917,319

(22) Filed: Mar. 9, 2018

(65) Prior Publication Data

US 2018/0196252 A1 Jul. 12, 2018

Related U.S. Application Data

(63) Continuation of application No. PCT/JP2016/003479, filed on Jul. 27, 2016.

(30) Foreign Application Priority Data

Dec. 4, 2015 (JP) .................................. 2015-237887

(51) Int. Cl.
*G02B 26/08* (2006.01)
*G02B 26/12* (2006.01)
(Continued)

(52) U.S. Cl.
CPC ......... *G02B 26/0816* (2013.01); *G02B 26/10* (2013.01); *G02B 26/123* (2013.01);
(Continued)

(58) Field of Classification Search
CPC .. G02B 26/0816; G02B 26/10; G02B 26/123; G02B 26/08; G02B 27/106;
(Continued)

(56) References Cited

U.S. PATENT DOCUMENTS 10,490,112 B2 * 11/2019 Ohara .................. G09G 3/2003
2006/0255243 A1 11/2006 Kobayashi et al.
(Continued)

FOREIGN PATENT DOCUMENTS

JP 2009086159 A 4/2009
JP 2010-175671 A 8/2010
(Continued)

*Primary Examiner* — John R Lee
(74) *Attorney, Agent, or Firm* — Procopio, Cory, Hargreaves & Savitch LLP

(57) ABSTRACT

A drawing apparatus includes a laser light source unit configured to output laser light; a scanning mirror unit configured to reflect and scan the laser light; a drawing control unit configured to control an output value of the laser light of the laser light source unit based on display image data so that a display image is drawn by the laser light in a range scanned by the scanning mirror unit; and an output adjustment control unit configured to control the laser light source unit so that characteristic detection laser light for adjusting the output value of the laser light is output outside a range in which the display image is drawn inside the range scanned by the scanning mirror unit. The output adjustment control unit controls the characteristic detection laser light to be intermittently output in one frame period.

4 Claims, 8 Drawing Sheets

(51) Int. Cl.
  *G02B 27/10* (2006.01)
  *G03F 7/20* (2006.01)
  *G09G 3/02* (2006.01)
  *G02B 26/10* (2006.01)
  *G02B 27/01* (2006.01)

(52) U.S. Cl.
  CPC ............ *G02B 27/106* (2013.01); *G03F 7/704* (2013.01); *G09G 3/02* (2013.01); *G02B 2027/0118* (2013.01)

(58) Field of Classification Search
  CPC ........ G02B 27/0101; G02B 2027/0118; G03F 7/704; G03F 7/70383; G09G 3/02; G09G 3/025
  See application file for complete search history.

(56) References Cited

U.S. PATENT DOCUMENTS

| | | |
|---|---|---|
| 2008/0094676 A1 | 4/2008 | Lach et al. |
| 2008/0095676 A1 | 4/2008 | Andretta |
| 2009/0116091 A1 | 5/2009 | Overmann et al. |
| 2009/0273660 A1 | 11/2009 | Regen et al. |
| 2010/0020251 A1 | 1/2010 | Kadijk et al. |
| 2010/0073580 A1 | 3/2010 | Ritz |
| 2011/0255564 A1* | 10/2011 | Chihara ............... H04N 9/3164 372/29.011 |
| 2013/0293591 A1 | 11/2013 | Miller et al. |
| 2014/0293235 A1 | 10/2014 | Azuma et al. |
| 2015/0002600 A1* | 1/2015 | Seki ................... G03G 15/0435 347/134 |
| 2015/0036105 A1* | 2/2015 | Ide .......................... G01S 17/08 353/31 |
| 2015/0092115 A1 | 4/2015 | Micewicz et al. |
| 2015/0092118 A1 | 4/2015 | Hada et al. |
| 2015/0161926 A1* | 6/2015 | Ogi ........................ G09G 3/346 345/207 |
| 2015/0205190 A1* | 7/2015 | Fukami ................ H04N 9/3111 353/31 |
| 2017/0013239 A1 | 1/2017 | Tabata et al. |
| 2017/0244944 A1* | 8/2017 | Ohara .................. H04N 9/3185 |
| 2017/0332059 A1* | 11/2017 | Tabata .................. H04N 9/3164 |
| 2017/0374330 A1* | 12/2017 | Okazaki ............... H04N 9/3129 |
| 2018/0137797 A1* | 5/2018 | Ohara .................. G09G 3/2003 |
| 2018/0196252 A1* | 7/2018 | Ohara ...................... G09G 3/02 |

FOREIGN PATENT DOCUMENTS

| | | |
|---|---|---|
| JP | 2013164503 A | 8/2013 |
| JP | 2014130256 A | 7/2014 |
| JP | 2015179917 A | 10/2015 |
| JP | 2015194694 A | 11/2015 |
| WO | 2015/146071 A1 | 10/2015 |

* cited by examiner

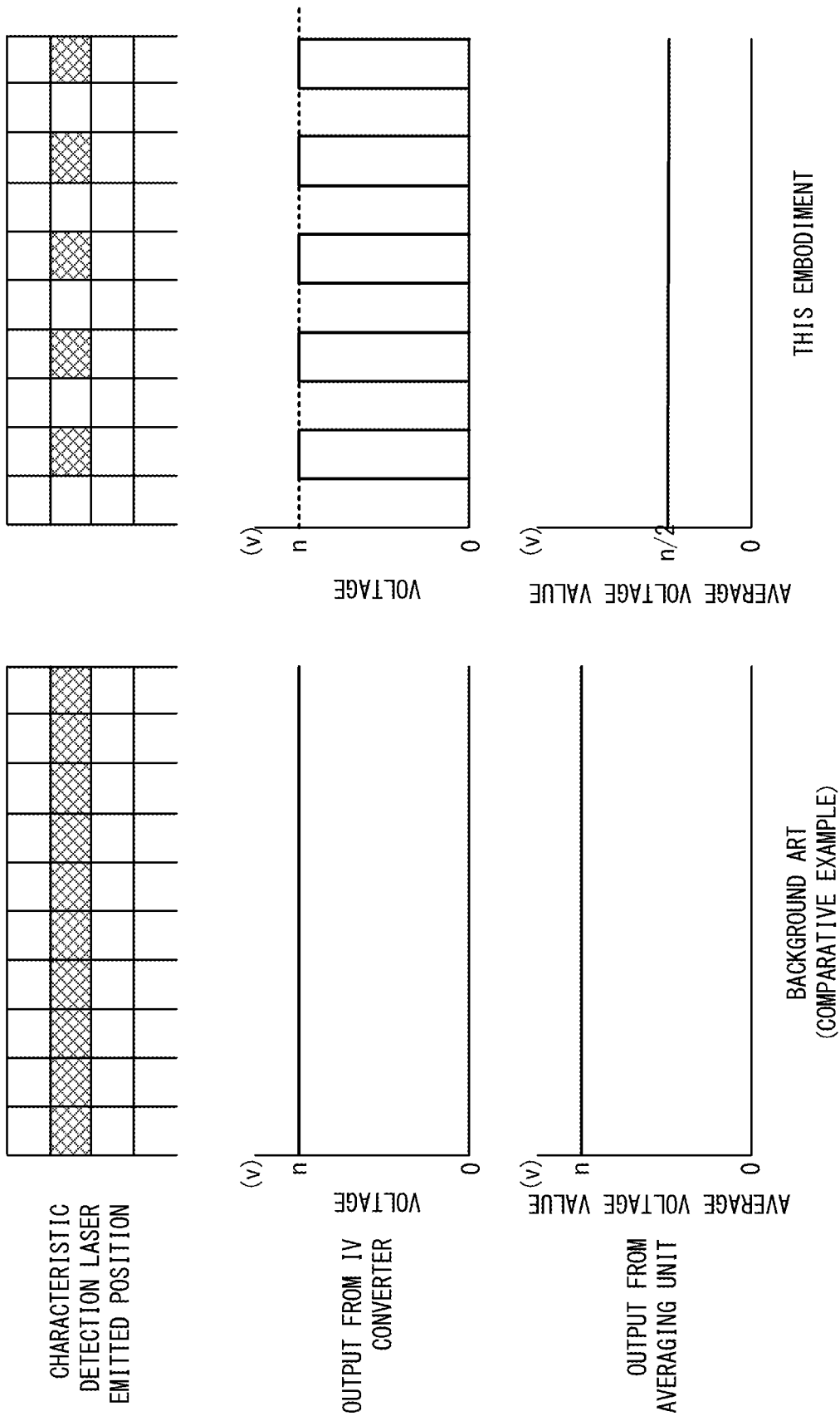

DRAWING APPARATUS AND DRAWING METHOD

CROSS REFERENCE TO RELATED APPLICATION

The present application is based upon and claims the benefit of priority from Japanese Patent Application No. 2015-237887, filed on Dec. 4, 2015, the entire contents of which are hereby incorporated by reference.

BACKGROUND

The present disclosure relates to a drawing apparatus and a drawing method.

As a drawing apparatus, a laser projector that two-dimensionally scans laser light output from a semiconductor laser and draws and displays a desired image on a screen has been developed (see Japanese Unexamined Patent Application Publication No. 2015-194694). At this time, the two-dimensional scanning area is divided into an image drawing area and a blanking area. The image drawing area is an area where an image to be displayed is drawn. The blanking area is a frame-shaped area surrounding the image drawing area.

Commonly, the I-L characteristic, which is the relationship between a driving current of a laser light source such as a semiconductor laser and an amount of output light, changes due to temperature variations in the laser light source itself.

In view of this, in a laser projector described in Japanese Unexamined Patent Application Publication No. 2015-194694, an APC (Auto Power Control) technique is adopted. In the APC technique, laser light (hereinafter referred to as "laser light for adjusting an output value of the laser light" or "characteristic detection laser light") is experimentally output from a laser light source, an amount of the output characteristic detection laser light is measured by a photodiode to obtain the I-L characteristic of the laser light source, and a driving current of the laser light source is periodically adjusted based on the I-L characteristic.

SUMMARY

In the APC technique of related art, the characteristic detection laser light is output to an area that is away from the image drawing area inside the blanking area, and the characteristic detection laser light is shielded from the image drawing area by using a shielding plate or the like so that the characteristic detection laser light is hidden from a user.

However, with such a drawing apparatus or drawing method, when a black image with no output laser light or a dark image with weakly output laser light is being drawn in the image drawing area, stray light due to the characteristic detection laser light leaks into the image drawing area or the blanking area, and the characteristic detection laser light may be visible to the user.

An embodiment provides a drawing apparatus including: a laser light source unit configured to output laser light; a scanning mirror unit configured to reflect and scan the laser light; a drawing control unit configured to control an output value of the laser light of the laser light source unit based on display image data so that a display image is drawn by the laser light in a range scanned by the scanning mirror unit; and an output adjustment control unit configured to control the laser light source unit so that characteristic detection laser light for adjusting the output value is output outside a range in which the display image is drawn inside the range scanned by the scanning mirror unit. The output adjustment control unit controls the characteristic detection laser light to be intermittently output in one frame period.

Further, the embodiment provides a drawing method including: inputting display image data; controlling an output value of laser light based on the display image data and drawing a display image by the laser light; and outputting characteristic detection laser light for adjusting the output value outside a range of the drawing. The outputting of the characteristic detection laser light includes outputting the characteristic detection laser light intermittently in one frame period.

BRIEF DESCRIPTION OF THE DRAWINGS

FIG. 7 is a diagram for describing an operation of a comparison unit 1221 according to the embodiment;

DETAILED DESCRIPTION

Figure 1:
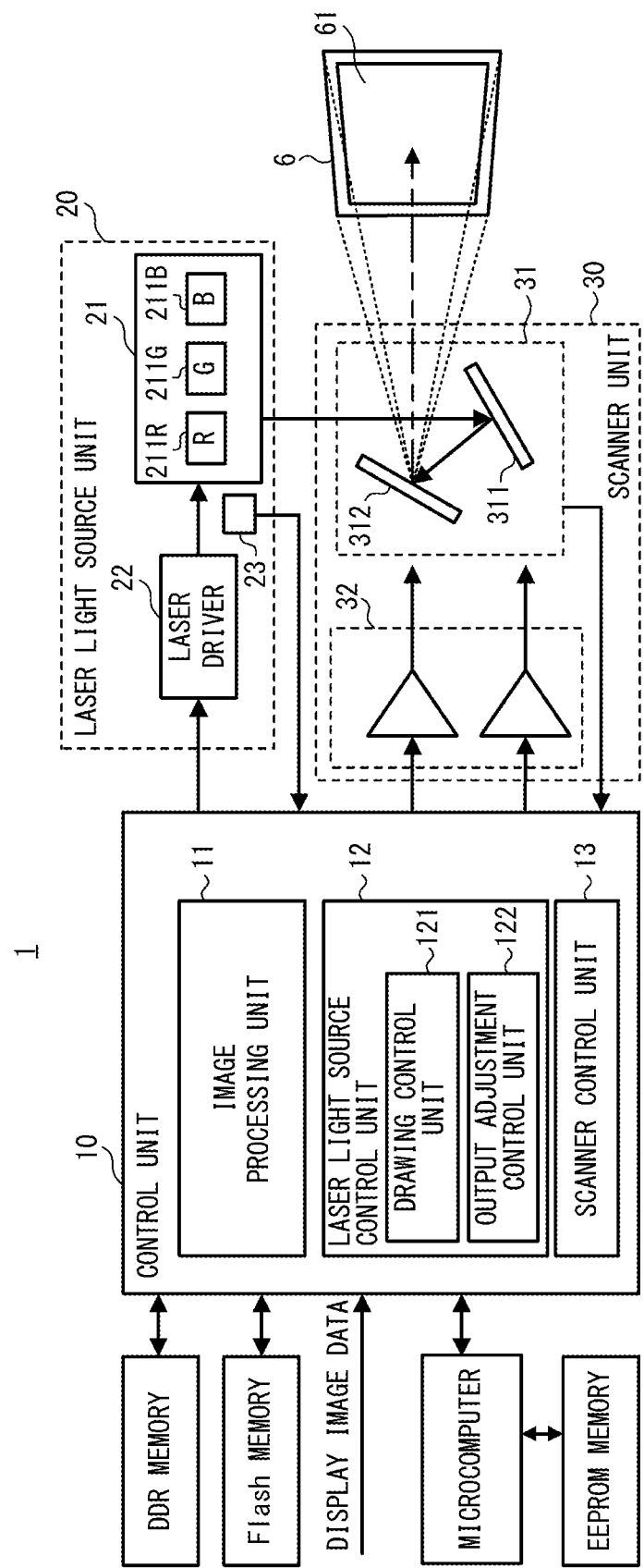
FIG. 1 is a block diagram showing a schematic configuration of a drawing apparatus 1 according to an embodiment.

Hereinafter, a drawing apparatus and a drawing method according to an embodiment will be described with reference to the drawings.

In the drawing apparatus or the drawing method according to this embodiment, laser light for adjusting an output value of the laser light, i.e., characteristic detection laser light, is intermittently output to a blanking area. Thus, even when the characteristic detection laser light temporarily leaks, luminance of stray light due to the characteristic detection laser light is low on a screen, and the influence of the leakage of the characteristic detection laser light on visibility of a display image can be reduced.

Note that the term "image" described in the present specification includes "still image" and "moving image (video)".

First, a configuration of the drawing apparatus according to this embodiment will be described.

FIG. 1 is a block diagram showing a schematic configuration of the image drawing apparatus 1 according to this embodiment.

The drawing apparatus 1 is, for example, a head-up display apparatus that is commonly mounted on a vehicle and presents various pieces of information as virtual images to a driver or the like who is a user.

The drawing apparatus 1 includes a control unit 10, a laser light source unit 20, a scanner unit 30 (scanning mirror unit), and the like.

The laser light source unit 20 includes a laser module 21 that outputs laser light, a laser driver 22 that drives laser diodes 211 included in the laser module 21, a light amount measuring unit 23 that measures an amount of output laser light, and the like.

The laser module 21 includes a red laser diode 211R, a green laser diode 211G, a blue laser diode 211B, and dichroic mirrors (not shown) corresponding to the red laser diode 211R, the green laser diode 211G, and the blue laser diode 211B, respectively.

The configuration of the laser module 21 may be the same as that described in Japanese Unexamined Patent Application Publication No. 2015-194694, and a detailed description thereof will be omitted in the present specification.

About 98% of the laser light output from the respective laser diodes 211 enters the scanner unit 30, and about 2% of the laser light enters the light amount measuring unit 23.

The laser driver 22 drives the laser diodes 211 based on a laser driving signal from the control unit 10.

The light amount measuring unit 23 measures an amount of incident laser light and outputs a result of the measurement to the control unit 10.

Figure 2:
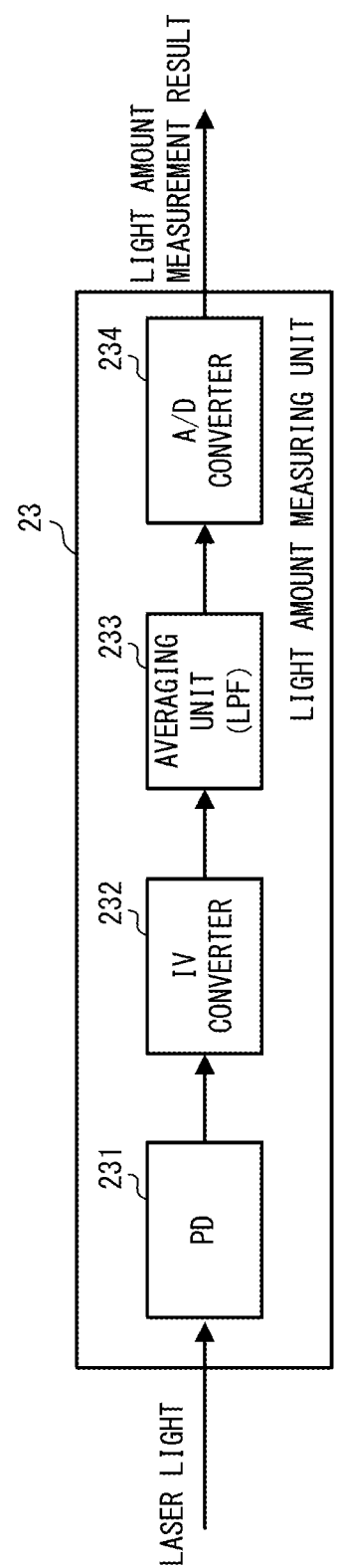
FIG. 2 is a block diagram showing a detailed configuration of a light amount measuring unit 23 according to the embodiment.

FIG. 2 is a block diagram showing a detailed configuration of a light amount measuring unit 23 according to this embodiment.

The light amount measuring unit 23 includes a photodiode (PD) 231, a current-to-voltage converter (IV converter) 232, an averaging unit (LPF) 233, an A/D converter 234, and the like.

The photodiode 231 photoelectrically converts the laser light output from the laser module 21, and outputs it as a photocurrent to the current-to-voltage converter 232.

The current-to-voltage converter 232 converts the photocurrent into a voltage and outputs the converted voltage to the averaging unit 233.

The averaging unit 233 averages the voltage values and outputs an average voltage value to the A/D converter 234.

The A/D converter 234 outputs, as a light amount measurement result, a value obtained by converting the average voltage value from analog to digital to the control unit 10.

The scanner unit 30 includes a scanner (scanning mirror unit) 31, a scanner driver 32, a scan angle detection unit (not shown), and the like. The scanner 31 reflects and scans the laser light output from the laser light source unit 20. The scanner driver 32 drives the scanner 31. The scan angle detection unit detects a scan angle of the scanner 31.

Further, the scanner 31 includes a vertical mirror 311, a horizontal mirror 312, and the like. The vertical mirror 311 reflects the laser light and scans it in the vertical direction. The horizontal mirror 312 reflects the laser light and scans it in the horizontal direction.

The configuration of the scanner unit 30 may be the same as that described in Japanese Unexamined Patent Application Publication No. 2015-194694, and a detailed description thereof will be omitted in the present specification.

The control unit 10 includes an image processing unit 11, a laser light source control unit 12, a scanner control unit 13, and the like. The control unit 10 includes, for example, an FPGA (Field Programmable Gate Array) and the like.

The image processing unit 11 adjusts the shape and brightness of drawing for input display image data.

The laser light source control unit 12 outputs the laser driving signal to the laser driver 22 to control the outputs of the laser diodes 211. At this time, the laser light source control unit 12 controls driving of the red, blue, and green laser diodes 211R, 211G, and 211B, respectively, in accordance with the colors and luminance of the drawing image based on the display image data.

To be more specific, the laser light source control unit 12 includes a drawing control unit 121, an output adjustment control unit 122, and the like.

The drawing control unit 121 rearranges the display image data processed by the image processing unit 11 into data of reciprocating drawing and outputs it to the laser driver 22. Further, the drawing control unit 121 controls synchronization processing of the laser light source unit 20 and the scanner unit 30, performs control processing of the laser driver 22, and controls an output value of the laser light of the laser light source unit 20, and the like.

Further, the drawing control unit 121 includes a line counter (not shown). The line counter counts the number of lines (pixel rows) of the display image data being output. The drawing control unit 121 evaluates as to whether the line being output is an image drawing area or a blanking area.

The output adjustment control unit 122 sets positions to which the characteristic detection laser light for adjusting the output value of the laser light of the laser light source unit 20 is to be output in such a way that the characteristic detection laser light is intermittently output outside a range where a display image 61 is to be drawn and partly above, below, to the left side, and to the right side of the image drawing range and then controls the drawing control unit 121.

At this time, the output adjustment control unit 122 also sets an emission color of the characteristic detection laser light.

The output adjustment control unit 122 further performs APC processing. In the APC processing, the output adjustment control unit 122 evaluates the state of the laser light source unit 20 based on the intensity of the characteristic detection laser light measured by the light amount measuring unit 23, determines driving current values of the laser diodes 211 at the time of drawing, and controls the laser driver 22.

The output adjustment control unit 122 adjusts an output for each of the laser diodes 211R, 211G, and 211B in the APC processing. Therefore, when the output of the red laser diode 211R is adjusted, the laser light is output only from the red laser diode 211R. Likewise, when the output of the green laser diode 211G is adjusted, the laser light is output only from the green laser diode 211G. When the output of the blue laser diode 211B is adjusted, the laser light is output only from the blue laser diode 211B.

Figure 3:
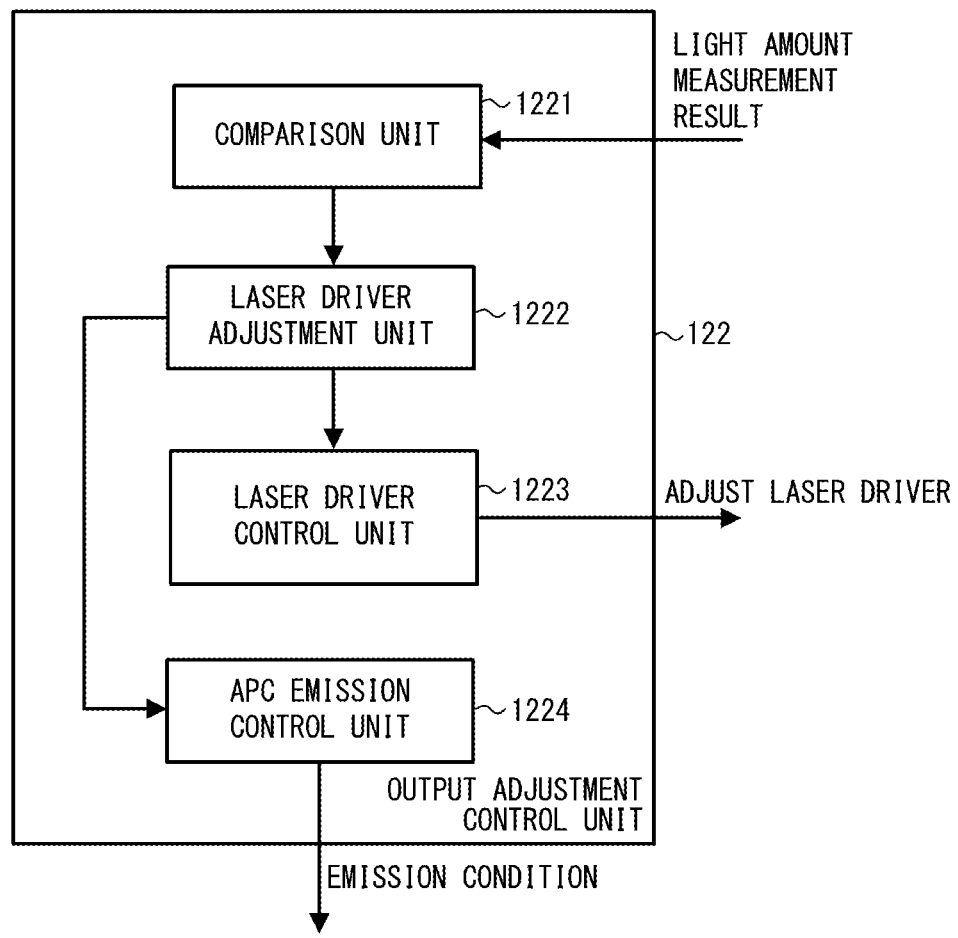
FIG. 3 is a block diagram showing a detailed configuration of an output adjustment control unit 122 according to the embodiment.

FIG. 3 is a block diagram showing a detailed configuration of an output adjustment control unit 122 according to this embodiment.

The output adjustment control unit 122 includes a comparison unit 1221, a laser driver adjustment unit 1222, a laser driver control unit 1223, an APC emission control unit 1224, and the like. Details of the output adjustment control unit 122 will be described later.

The scanner control unit 13 outputs a scanner driving signal to the scanner driver 32 and controls scanning of the laser light by the scanner 31. The scanner control unit 13 monitors a detection signal of the scan angle detection unit (not shown) that detects the scan angle of the scanner 31 and performs control on the scan angle, waveform generation, oscillation frequency, and the like of the scanner 31.

With such a configuration, the drawing apparatus 1 draws the display image 61 by the scanner unit 30 reflecting and scanning the laser light output from the laser light source unit 20 based on the display image data input by the control unit 10, and projecting the laser light on the screen 6. When the drawing apparatus 1 is a head-up display apparatus, the screen 6 is commonly an intermediate image screen. Although the configuration of the head-up display apparatus is not shown, a drawing image projected on the intermediate image screen is projected onto a combiner or a windshield of an automobile via reflection of a concave mirror or the like.

Note that the respective components implemented by the control unit 10 can be implemented by executing programs under the control of a calculation apparatus (not shown) included in the control unit 10, which is, for example, a computer. More specifically, the control unit 10 loads programs stored in a storage unit (not shown) to a main storage apparatus (not shown) and implements the respective components by executing the programs under the control of the calculation apparatus. Further, the respective components may not only be implemented by software including programs but also implemented by a combination of hardware, firmware, and software and the like.

The above-mentioned programs can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (Read Only Memory), CD-R, CD-R/W, and semiconductor memories (such as mask ROM, PROM (Programmable ROM), EPROM (erasable PROM), flash ROM, RAM (random access memory), etc.).

The program may be provided to the computer using any type of transitory computer readable media. Examples of transitory computer readable media include electric signals, optical signals, and electromagnetic waves. Transitory computer readable media can provide the program to the computer via a wired communication line (e.g. electric wires, and optical fibers) or a wireless communication line.

Next, the output positions of the characteristic detection laser light according to this embodiment will be described.

Figure 4:
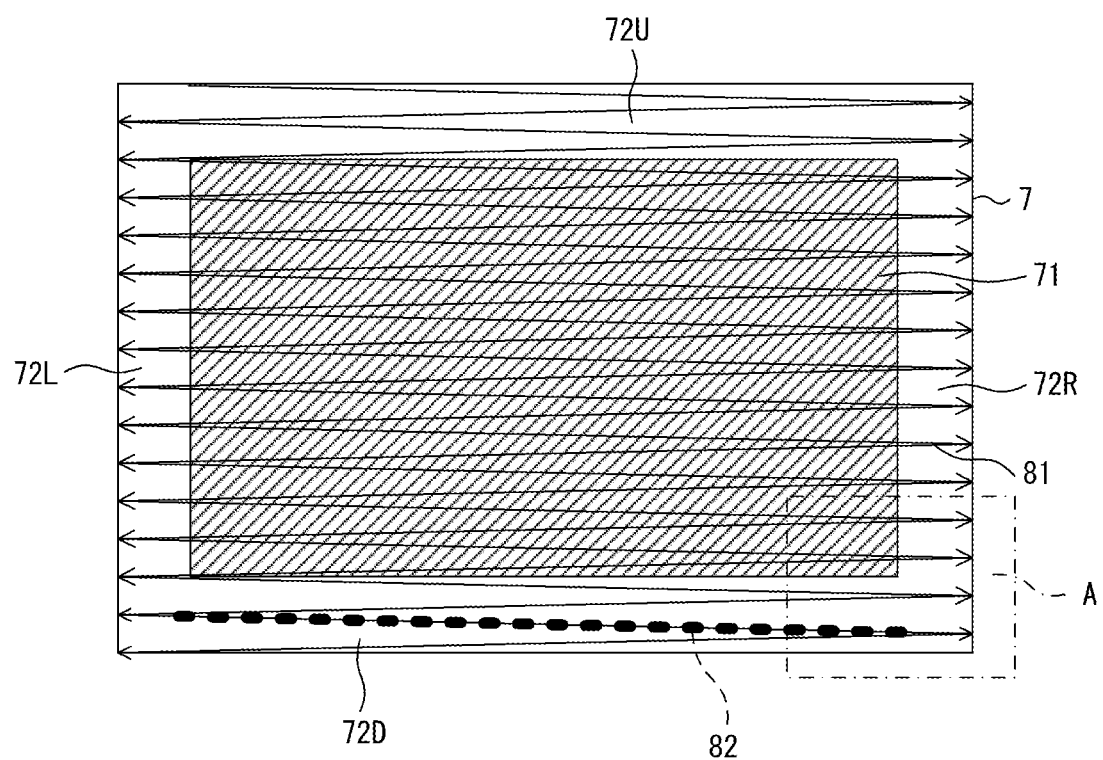
FIG. 4 is a diagram showing output positions of characteristic detection laser light according to the embodiment.

FIG. 4 is a diagram for showing the output positions of the characteristic detection laser light according to this embodiment.

A scanning area 7 is an area in which the laser light can be scanned by the scanner 31. As mentioned above, the scanning area 7 is divided into an image drawing area 71 and a blanking area 72. The image drawing area 71 is a rectangular area where laser light for drawing a display image 61 is output. The blanking area 72 is an area where the laser light for drawing the display image 61 is not output. Here, it is assumed that the blanking area 72 is composed of an upper blanking area 72U, a lower blanking area 72D, a left blanking area 72L, and a right blanking area 72R.

In the drawing method according to this embodiment, a scanning trajectory 81 (thin solid lines) of the scanner 31 falls within the range of the scanning area 7. The scanner 31 reciprocally raster-scans the scanning area 7 between the left and right sides from the upper side to the lower side of the scanning area 7 and then scans to return from the lower side to the upper side of the scanning area 7 (the returning scanning lines are not shown).

Further, a scanning trajectory 82 (thick solid lines) at the timing when the characteristic detection laser light is output is in an area away from the image drawing area 71 inside the blanking area 72.

Figure 5:
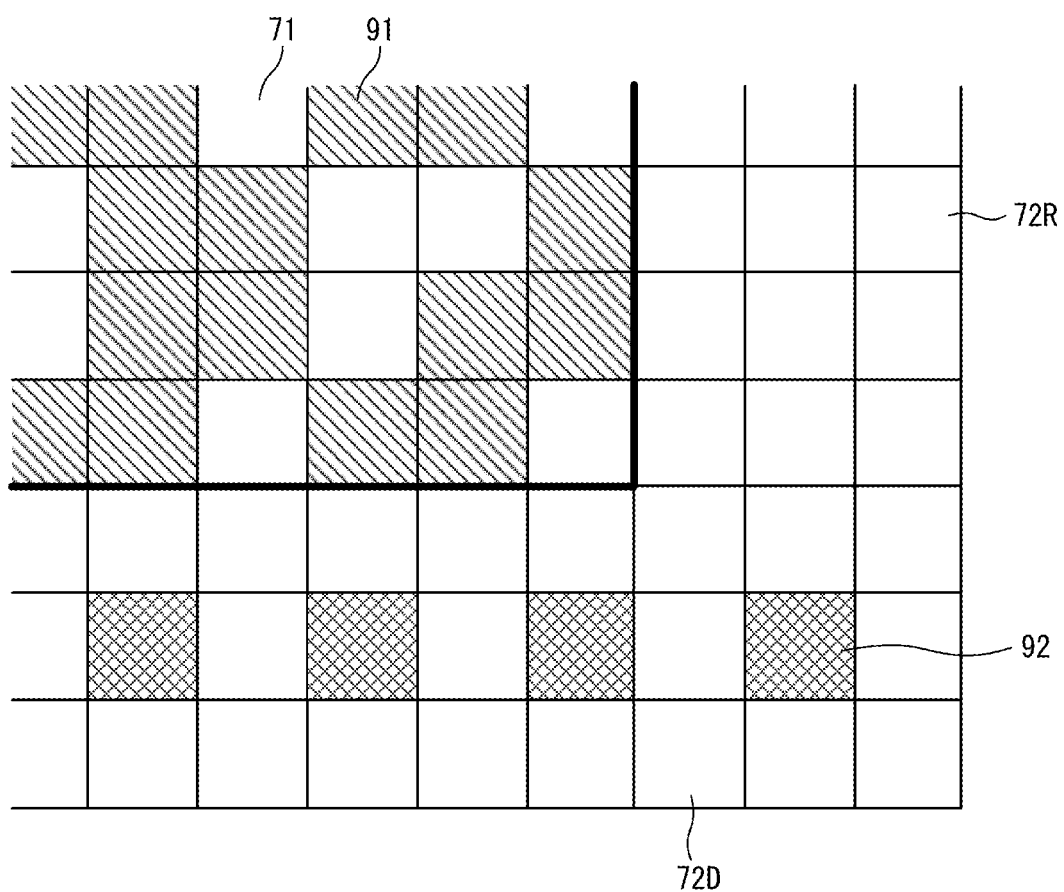
FIG. 5 is another diagram for describing the output positions of the characteristic detection laser light according to the embodiment.

FIG. 5 is another diagram for describing the output positions of the characteristic detection laser light according to this embodiment. FIG. 5 is an enlarged view of an area of a range A in FIG. 4. Each square indicates an area for one pixel. The hatched squares indicate pixels to which the laser light for drawing or the characteristic detection laser light is to be output. The non-hatched squares indicate pixels to which the laser light for drawing or the characteristic detection laser light is not to be output.

Note that the bold line in FIG. 5 is for clearly indicating the boundary between the image drawing area 71 and the blanking area 72. Such a thick line does not actually exist.

In the image drawing area 71, the laser light for drawing is output to pixels 91. The positions of the pixels 91 are set based on the display image data.

On the other hand, in the blanking area 72, the characteristic detection laser light is output to pixels 92. In related art, the positions of the pixels 92 are set in such a way that the pixels 92 are continuous in one pixel row or one pixel column that is away from the image drawing area 71 inside the blanking area 72. However, in the drawing apparatus or the drawing method according to this embodiment, the positions of the pixels 92 are set in such a way that the pixels 92 are set at every other pixel in one pixel row or one pixel column that is away from the image drawing area 71 inside the blanking area 72.

It is obvious that as the characteristic detection laser light is shielded by a shielding plate or the like, the characteristic detection laser light is not drawn at the positions of the pixel 92 on the screen 6.

Next, the APC operation of the drawing apparatus 1 according to this embodiment will be described with reference to FIGS. 3 and 6.

Figure 6:
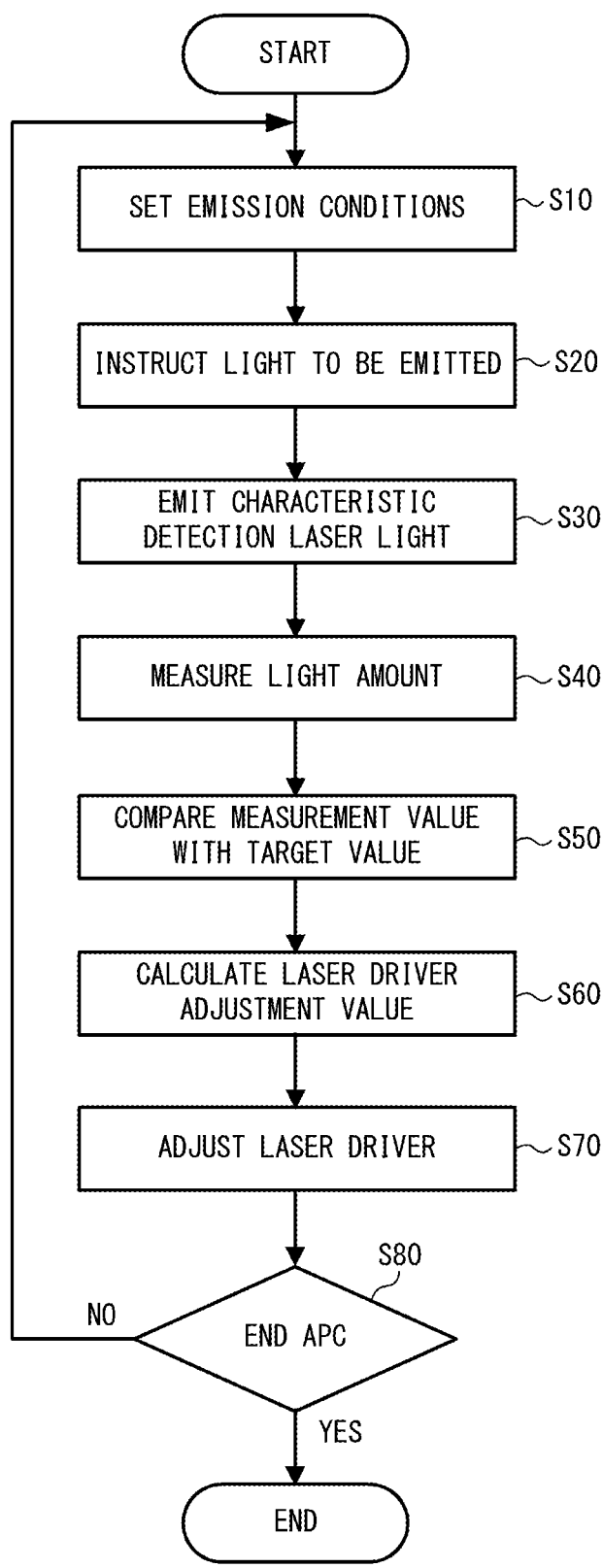
FIG. 6 is a flowchart showing a processing procedure of an APC operation according to the embodiment.

FIG. 6 is a flowchart showing a processing procedure of the APC operation according to this embodiment.

First, the APC emission control unit 1224 sets emission conditions such as emission color, emission amount (output value), emission pattern (emission position), and the like of the characteristic detection laser light and outputs the emission conditions to the drawing control unit 121 (Step S10).

Next, the drawing control unit 121 instructs the laser driver 22 to emit the characteristic detection laser light based on the above emission conditions (Step S20).

Note that, at this time, the drawing control unit 121 also instructs the laser driver 22 to emit the laser light for drawing based on the display image data.

Next, when the scan by the scanner 31 reaches the above-mentioned emission position, the laser diodes 211 intermittently emit the characteristic detection laser light (Step S30). At this time, the dichroic mirrors (not shown) in the laser module 21 reflect a few % of the total light emitted by the laser diodes 211, and the light amount measuring unit 23 measures the light amount of the reflected light and outputs a result of the measurement to the control unit 10 (Step S40).

Next, the comparison unit 1221 compares the light amount measurement result with a target light amount, calculates a difference between them, and outputs the difference to the laser driver adjustment unit 1222 (Step S50). That is, it is checked as to whether or not the current output value of the laser light (or the characteristic detection laser light) is a predetermined output value. A luminance level required for dimming, for example, a maximum light emission level at the current dimming level is set as the target light amount. Further, the laser diodes 211 emit light with this target light amount.

FIG. 7 is a diagram for describing an operation of the comparison unit 1221 according to this embodiment. On the left side of FIG. 7, the case of the background art as a comparative example is shown. On the right side of FIG. 7, the case of this embodiment is shown. Further, in order from the top of FIG. 7, the light emission positions of the characteristic detection laser light (each square indicates one pixel), the output voltage of the current-to-voltage converter (IV converter) 232 and the output average voltage value of the averaging unit 233 in association with each other are shown.

In the drawing apparatus or the drawing method according to the background art, the characteristic detection laser light is continuously emitted in one pixel row (column). Therefore, in the pixel row, the output voltage of the current-to-voltage converter 232 is constant at, for example, n(V), and the output of the averaging unit 233 is also constant at n(V), which is the output voltage of the current-to-voltage converter 232.

On the other hand, in the drawing apparatus or the drawing method according to this embodiment, in one pixel row (column), the characteristic detection laser light is emitted in every other pixel with the same emission intensity as the emission intensity according to the background art. Therefore, in this pixel row, the output voltages of the current-to-voltage converter 232 become n(V) which is the same value as that of the background art and 0(V) alternately in each pixel. Further, the output of the averaging unit 233 is n/2(V).

Therefore, when the light amount measurement result is compared with the target light amount, the comparison unit 1221 doubles the value output by the light amount measuring unit 23 and compares the doubled value with the target light amount. Then, the brightness (light amount measurement result) when the characteristic detection laser light is intermittently emitted is reduced by half as compared with the brightness when the characteristic detection laser light is continuously emitted. However, after this, the control unit 10 can control the light emission amount of the laser light or the characteristic detection laser light in a manner similar to that when the characteristic detection laser light is continuously emitted.

Next, the laser driver adjustment unit 1222 calculates a laser driver adjustment value for setting the emission amount of the drawing area from the difference between the light amount measurement result and the target light amount, and outputs the calculated laser driver adjustment value to the laser driver control unit 1223 and the APC emission control unit 1224 (Step S60). The laser driver adjustment unit 1222 calculates the laser driver adjustment value in such a way that, when the light amount measurement result is lower than the target light amount, the emission amount of the laser diodes 211 is increased, while when the light amount measurement result is greater than the target light amount, the emission amount of the laser diodes 211 is reduced.

Next, the laser driver control unit 1223 adjusts the laser driver 22 based on the laser driver adjustment value (Step S70).

Then, the output adjustment control unit 122 determines as to whether the APC operation is to be ended (Step S80). For example, when the light amount measurement result and the target light amount match, the output adjustment control unit 122 determines that the APC operation is to be ended.

When the output adjustment control unit 122 determines that the APC operation is not to be ended (No in Step S80), the process returns to Step S10. In Step S10, the APC emission control unit 1224 controls emission of the characteristic detection laser light based on the laser driver adjustment value, and performs the operations from Step S20 onward.

On the other hand, when the output adjustment control unit 122 determines that the APC operation is to be ended (Yes in Step S80), the APC operation is ended.

As described above, in the drawing apparatus or the drawing method according to this embodiment, the emission intensity of the characteristic detection laser light is not changed, the method of emitting the characteristic detection laser light is changed, and the characteristic detection laser light is intermittently output in one frame period or one pixel row (column). That is, in this embodiment, the characteristic detection laser light is intermittently emitted during the period during which the characteristic detection laser light is continuously emitted in the background art. Thus, even when the characteristic detection laser light temporarily leaks, luminance of stray light due to the leakage of the characteristic detection laser light is low on a screen 6, and the influence of the leakage of the characteristic detection laser light on visibility of a display image 61 can be reduced.

Note that in the drawing apparatus or the drawing method according to this embodiment, the positions to which the characteristic detection laser light is output are set at every other pixel. However, the positions (the pixels, timings) to which the characteristic detection laser light is output may be set in such a way that they do not overlap between frames in a predetermined number of continuous frames.

Figure 8A:
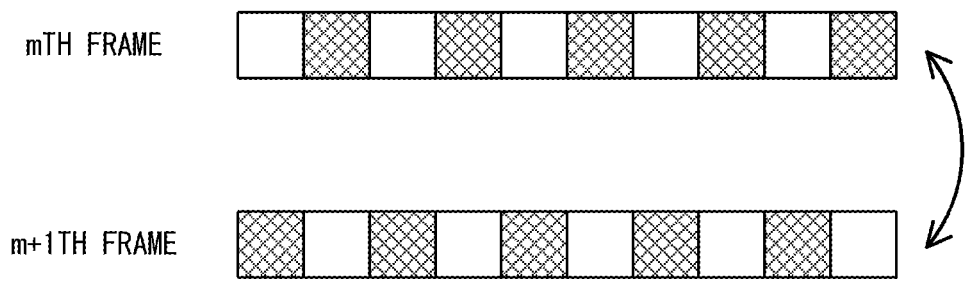
FIG. 8A is a diagram showing other output positions of the characteristic detection laser light according to the embodiment.
Figure 8B:
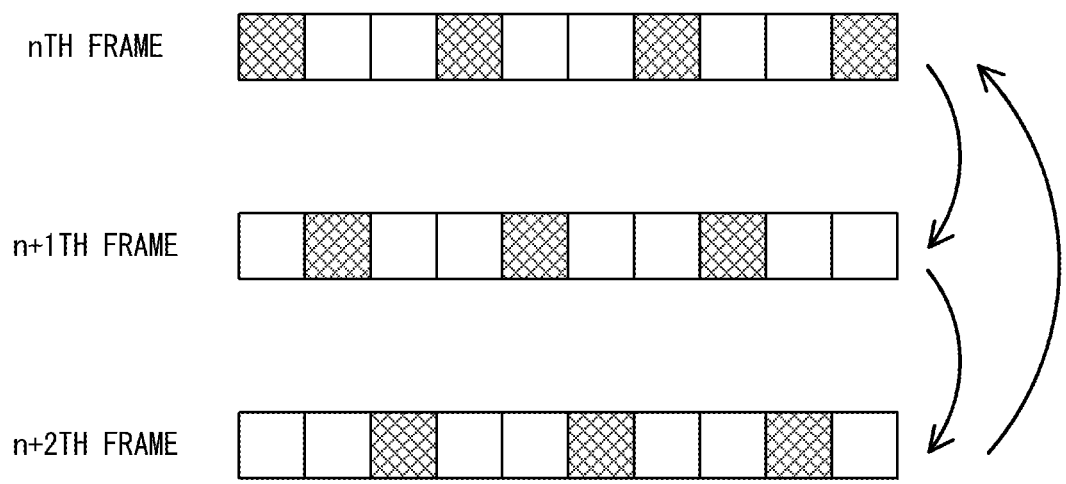
FIG. 8B is a diagram showing other output positions of the characteristic detection laser light according to the embodiment.

FIGS. 8A and 8B are diagrams showing other output positions of the characteristic detection laser light according to this embodiment. FIG. 8A shows a case where the positions to which the characteristic detection laser light is output do not overlap in two continuous frames (an mth frame and an m+1th frame). FIG. 8B shows a case where the positions to which the characteristic detection laser light is output do not overlap in three continuous frames (an nth frame, an n+1th frame, and an n+2th frame).

By doing so, the luminance of the stray light on the screen 6 due to the leakage of the characteristic detection laser light can be reduced by ½ or ⅓.

Note that the positions to which the characteristic detection laser light is output may be set at random in each frame as long as the positions to which the characteristic detection laser beam is output do not overlap between a plurality of continuous frames.

Moreover, in the drawing apparatus or the drawing method according to this embodiment, the characteristic detection laser light is output every other pixel. That is, the characteristic detection laser light is output and stopped from being output repeatedly every other pixel. Alternatively, the characteristic detection laser light may be output and stopped from being output repeatedly every plurality of pixels.

Further, in the drawing apparatus or the drawing method according to this embodiment, the characteristic detection laser light is intermittently output to one pixel row or one pixel column of the blanking area 72. Alternatively, the characteristic detection laser light may be intermittently output to a plurality of pixel rows or a plurality of pixel columns of the blanking area 72.

Furthermore, in the drawing apparatus or the drawing method according to this embodiment, the characteristic detection laser light is output to the lower blanking area 72D. Alternatively, the characteristic detection laser light may be output to one or two or more areas or a part of the upper blanking area 72U, the lower blanking area 72D, the left blanking area 72L, and the right blanking area 72R as long as the driving current of the laser light source can be adjusted.

As described above, the drawing apparatus 1 according to this embodiment includes the laser light source unit 20 that outputs laser light, the scanning mirror unit 30 that reflects and scans the laser light, the drawing control unit 121 that controls the output value of the laser light of the laser light source unit 20 based on display image data so that the display image 61 is drawn by the laser light in the range 7 scanned by the scanning mirror unit 30, and the output adjustment control unit 122 that controls the laser light source unit 20 so that characteristic detection laser light for adjusting the output value of the laser light is output outside the range 71 in which the display image is drawn inside the range 7 scanned by the scanning mirror unit 30. The output adjustment control unit 122 controls the characteristic detection laser light to be intermittently output in one frame period.

Additionally, in the drawing apparatus 1 according to this embodiment, the output adjustment control unit 122 can control the characteristic detection laser light to be output so that the timings at which the characteristic detection laser light is output will not overlap between frames in a period of a predetermined number of continuous frames.

Moreover, in the drawing apparatus 1 according to the embodiment, the output adjustment control unit 122 can control the characteristic detection laser light to be output and stopped from being output repeatedly every pixel or every plurality of pixels.

The drawing method according to the embodiment includes inputting the display image data; controlling the output value of the laser light based on the display image data and drawing the display image 61 by the laser light, and Step S30 of outputting the characteristic detection laser light for adjusting the output value outside the range 71 of the drawing. The Step S30 of the outputting of the characteristic detection laser light includes intermittently outputting the characteristic detection laser light in one frame period.

The drawing apparatus according to the embodiment intermittently outputs characteristic detection laser light for adjusting an output value of laser light in one frame period to adjust a driving current of a laser light source and is susceptible of industrial application.

What is claimed is:

1. A drawing apparatus comprising:
a laser light source unit configured to output laser light;
a scanning mirror unit configured to reflect and scan the laser light;
a drawing control unit configured to control an output value of the laser light of the laser light source unit based on display image data so that a display image is drawn by the laser light in a range scanned by the scanning mirror unit; and
an output adjustment control unit configured to control the laser light source unit so that characteristic detection laser light for adjusting the output value is output outside a range in which the display image is drawn inside the range scanned by the scanning mirror unit, wherein the output adjustment control unit controls the characteristic detection laser light to be intermittently output in one frame period in such a way that timings at which the characteristic detection laser light is output will not overlap between frames in a predetermined number of continuous frames.

2. The drawing apparatus according to claim 1, wherein the output adjustment control unit controls the characteristic detection laser light to be output and stopped from being output repeatedly by a unit of one or a plurality of pixels.

3. The drawing apparatus according to claim 1, wherein the output adjustment control unit adjusts the output value by comparing a value obtained by multiplying a light amount measurement result of the characteristic detection laser light output intermittently by a factor with a target value, and wherein the factor corresponds to a unit of repeating the outputting of the characteristic detection laser light and the stopping of the characteristic detection laser light from being output.

4. A drawing method comprising:
inputting display image data;
controlling an output value of laser light based on the display image data and drawing a display image by the laser light; and outputting characteristic detection laser light for adjusting the output value outside a range of the drawing, wherein the outputting of the characteristic detection laser light includes outputting the characteristic detection laser light intermittently in one frame period in such a way that timings at which the characteristic detection laser light is output will not overlap between frames in a predetermined number of continuous frames.

* * * * *